United States Patent [19]

Kurosawa et al.

[11] 4,368,503
[45] Jan. 11, 1983

[54] HOLLOW MULTILAYER PRINTED WIRING BOARD

[75] Inventors: Keiji Kurosawa; Kenji Yamamoto; Mitsuo Yamashita; Hisami Mitsui; Ayako Miyabara, all of Nagano; Kiyotaka Miyagawa, Suzaka; Takayoshi Imura, Nagano, all of Japan

[73] Assignee: Fujitsu Limited, Kawasaki, Japan

[21] Appl. No.: 229,594

[22] PCT Filed: May 23, 1980

[86] PCT No.: PCT/JP80/00111
§ 371 Date: Jan. 24, 1981
§ 102(e) Date: Jan. 16, 1981

[87] PCT Pub. No.: WO80/02633
PCT Pub. Date: Nov. 27, 1980

[30] Foreign Application Priority Data

May 24, 1979 [JP] Japan .................... 54-64329

[51] Int. Cl.³ .............................. H05K 1/14
[52] U.S. Cl. ................... 361/414; 174/68.5; 361/385; 361/382; 361/415
[58] Field of Search ............. 174/68.5; 361/382, 383, 361/384, 385, 412, 414, 415

[56] References Cited

U.S. PATENT DOCUMENTS

| 3,365,620 | 1/1968 | Butler | 361/382 |
| 3,568,000 | 3/1971 | D'Aboville et al. | 361/414 |
| 3,616,532 | 11/1971 | Beck | 174/68.5 X |
| 3,648,131 | 3/1972 | Stuby | 174/68.5 X |
| 3,740,678 | 6/1973 | Hill | 174/68.5 X |
| 3,760,091 | 9/1973 | Cannizzaro et al. | 361/414 X |
| 3,780,352 | 12/1973 | Redwanz | 361/414 |
| 3,875,479 | 4/1975 | Jagger | 361/414 |
| 3,999,105 | 12/1976 | Archey | 361/385 |

Primary Examiner—R. R. Kucia
Attorney, Agent, or Firm—Staas & Halsey

[57] ABSTRACT

A hollow multilayer printed wiring board and a process for manufacturing the same are provided. The hollow multilayer printed wiring board is comprised of a plurality of printed substrates (1), (2), (3) and (4), superposed upon each other with a predetermined space therebetween each of which substrate has a signal conductor pattern (6) formed on at least one surface thereof and a land conductor pattern (7) formed on at least one surface thereof. Each substrate has plated throughholes (10) in the land conductor pattern, each of which holes is in line with another plated throughhole of at least one of the neighboring substrates to form a throughhole or an interstitial via hole (12) or (13). A layer of a low melting point metal is formed at least on the upper and lower end surfaces of each plated throughholes (10), which layer serves as a through connection between two or more signal conductor patterns of the substrates and as an interlayer adhesion between the substrates. The superposed substrates, except for at least one surface substrate, are made of a thermally resistant organic synthetic resin sheet or an insulation-treated metal.

14 Claims, 61 Drawing Figures

Fig. IID
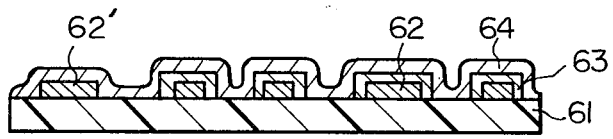
Fig. IIE
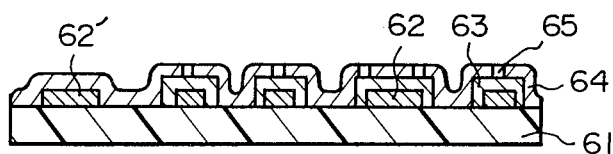

HOLLOW MULTILAYER PRINTED WIRING BOARD

BACKGROUND OF THE INVENTION

1. Field of the Invention

This invention relates to a hollow multilayer printed wiring board. By the term "hollow multilayer printed wiring board" used herein is meant a multilayer printed wiring board which comprises at least two insulating material substrates, on each of which a conductor pattern or patterns are formed, the conductor pattern or patterns being interconnected as may be required, and each of which substrate being spaced apart a predetermined distance from the adjacent substrate or substrates, the space being filled with an insulating gas or liquid.

2. Description of the Prior Art

The trend toward producing transistors, integrated circuits and other electronic devices and parts of small sizes in recent years has required a substantial increase in the wiring density of multilayer printed wiring boards by reducing the spaces between the parts. For this requirement substrates having an enhanced dimensional stability must be used. Furthermore, the signal conductor patterns must be arranged close to each other, which results in the following defects. First, electrical signals of a signal pattern are transferred to another neighboring signal pattern and interfere with the signals therein or produce noise, that is, the occurrence of so-called crosstalk phenomenon arises. Secondly, the parts, particularly where they are directly bonded to the substrate, cause a temperature rise in the surface of the substrate, thereby influencing the characteristics of the parts and the substrate, and occasionally damaging the parts.

Most conventional multilayer printed wiring boards are prepared by laminating substrates, having formed thereon conductor patterns, by interposing an adhesive layer comprised of glass fibers impregnated with a prepolymer of a thermosetting resin between the substrates. The adhesive layer used, however, must satisfy many requirements, such as good thermal resistance, low shrinkage upon curing and good moldability. With an increase in the packaging density, it becomes more and more difficult to manufacture the composite structure by using the adhesive layer of thermosetting resin-impregnated glass fibers.

SUMMARY OF THE INVENTION

It is, therefore, the main object of the present invention to provide multilayer printed wiring boards which exhibit good thermal resistance, as well as enhanced dimensional stability, and improved transmission and cooling characteristics, as compared with the prior art.

Other objects and advantages of the present invention will be apparent from the following description.

In one aspect of the present invention, there is provided a hollow multilayer printed wiring board which comprises a plurality of substrates superposed upon each other with a predetermined space therebetween filled with an insulating gas or liquid, with or without an interposed spacer or spacers. Each of these substrates has a signal conductor pattern formed on at least one surface thereof and a ground conductor pattern formed on at least one surface thereof. Each substrate has plated through holes in the ground conductor pattern, each of which holes is in line with another plated through hole of each of the neighboring substrates or of at least one of the neighboring substrates to form a continuous plated through hole or an interstitial through hole. A layer of a low melting point metal is formed at least on the upper and lower end surfaces of the plating layer defining each plated through hole. The low melting point metal layer serves as a through connection between two or more signal conductor patterns of the substrates and as an interlayer adhesion between the substrates. The superposed substrates, except for at least one surface substrate, are made of a thermally resistant organic synthetic resin sheet or an insulation-treated metal sheet.

In another aspect of the present invention, there are provided processes for manufacturing the above-mentioned hollow multilayer printed wiring board. A first process comprises the steps of:

preparing a plurality of substrates made of a thermally resistant organic synthetic resin sheet or an insulation-treated metal sheet, each substrate having a signal conductor pattern formed on at least one surface thereof and a ground conductor pattern formed on at least one surface thereof and further having plated through holes in the ground conductor pattern, a layer of a low melting point metal being formed at least on the upper and lower end surfaces of each of the plating layers defining the plated through holes; and superposing the substrates upon each other so that each of the plated through holes is in line with another plated through hole of each of the neighboring substrate or of at least one of the neighboring substrates, followed by applying pressure and heat sufficient for melt-adhering the substrate having the low melting point metal layer to the neighboring substrate or substrates.

A second process comprises the steps of:

preparing printed substrates made of a thermally resistant organic synthetic resin sheet or an insulation-treated metal sheet, each substrate having a signal conductor pattern on at least one surface thereof and a ground conductor pattern on at least one surface thereof, and further having a layer of a low melting point metal formed at least on the ground conductor pattern;

superposing the substrates upon each other so that the ground conductor pattern having the low melting point metal layer on each substrate is in contact with the ground conductor pattern or patterns having the low melting point metal layer of the neighboring substrate or substrates, followed by applying pressure and heat sufficient for melt-adhering the substrate having the low melting point metal layer to the neighboring substrate or substrates, and;

boring through holes in the melt-adhered ground conductor patterns of the superposed substrates, followed by forming plating conductor layers on at least the inner walls of the through holes to complete plated through holes serving as a through connection between the two or more signal conductor patterns of the superposed substrates.

BRIEF DESCRIPTION OF DRAWINGS

FIGS. 11B through 11E schematically represent, in cross-section, the sequential steps of preparing the printed substrate shown in FIG. 11A.

DESCRIPTION OF THE PREFERRED EMBODIMENTS

The substrates used for the construction of the hollow multilayer printed wiring board of the invention, except for at least one surface substrate, are made of a thermally resistant organic synthetic resin sheet or an insulation-treated metal sheet. The organic synthetic resin used includes, for example, a polyimide resin, an epoxy resin and a triazine resin. The insulation-treated metal used includes, for example, anodically oxidized metals, such as anodically oxidized aluminum, magnesium, titanium and thallium; and metal sheets having insulation material layers deposited thereon, such as an iron sheet coated with an organic synthetic resin or an inorganic insulating material and an iron sheet sputtered with a non-conductive material. The most preferable insulation-treated metals are those which are prepared by anodically oxidizing a metal and, then, depositing an insulation material layer on the anodically oxidized metal. In general, an anodically oxidized insulation layer is homogeneous. However, when the thickness of the anodically oxidized insulation layer is increased in order to enhance its mechanical strength and insulation reliability, pin holes are liable to occur in the insulation layer. In contrast, an insulation layer formed by coating or sputtering exhibits poor homogeneity, although it can be made desirably thick. The insulation-treated metals prepared by the combination of anodic oxidation with deposition of an insulation material layer are advantageous in that the insulation layer is relatively homogeneous and can be made into the desired thickness.

In the hollow multilayer printed wiring board of the present invention, a through connection between the two or more conductor patterns and an interlayer adhesion between the superposed substrates are achieved by using a low melting point metal. By the term "low melting point metal" used herein is meant a metal which possesses a melting point lower than the temperature at which the substrate is adversely affected to a considerable extent. The low melting metal includes, for example, a simple metal such as gold and tin and alloys such as tin-lead, cadmium-zinc, tin-lead-silver, lead-silver, tin-zinc and cadmium-silver.

Typical examples of the hollow multilayer printed wiring board of the present invention and processes for manufacturing them are illustrated with reference to the accompanying drawings.

FIGS. 1A through 1D exempifies the hereinbefore mentioned first process wherein plated through holes are formed in printed substrates made of a thermally resistant organic synthetic resin and, then, the printed substrates are superposed upon each other.

Figure 1A:
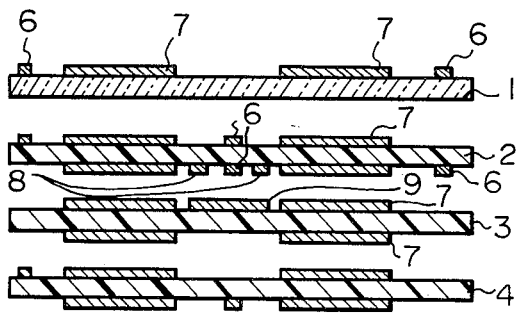
FIGS. 1A through 1D schematically represent, in cross-section, the sequential steps of manufacturing a hollow multilayer printed wiring board according to one preferred embodiment of the process of the present invention.

Referring to FIG. 1A, a ceramic substrate 1 is used as the surface substrate, and two intermediate substrates 2 and 4 made of a thermally resistant organic synthetic resin, such as a polyimide or an epoxy resin, are positioned so that a spacer 3 made of a similar organic synthetic resin is interposed between them. Each of the substrates 1, 2 and 4 has a signal conductor pattern 6 on at least one surface thereof and a ground conductor pattern 7 on at least one surface thereof. The spacer 3 has ground conductor patterns 7 on both surfaces thereof. The signal conductor pattern 6 formed on the lower surface of the substrate 2 is sandwiched between conductors of a first ground conductor pattern 8 electrically isolated from the signal conductor pattern 6 and formed on the same surface of the substrate on which the signal conductor pattern 6 is formed. Furthermore, the signal conductor pattern 6 formed on the lower surface of the substrate 2 is covered with a second ground conductor pattern 9, which is electrically isolated from the signal conductor pattern 6 and formed on the upper surface of the spacer 3 confronting the substrate 2. The second ground conductor pattern 9 has an area sufficient for covering the signal conductor pattern 6 and the conductors of the first ground conductor pattern 8, formed on the confronting surface of the substrate 2.

Figure 1B:
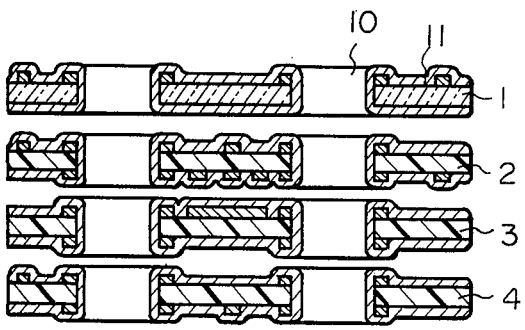

Referring to FIG. 1B, through holes 10 are bored in the land conductor pattern 7 of each of the substrates 1, 2 and 4 and the spacer 3. The substrates and the spacer, having the through holes 10 perforated therein, are then subjected to electroless deposition to form a conductor deposition layer 11 over the entire surface of each substrate or spacer, including the inner walls of the through holes, so that the substrates and the spacer can be subjected to electroplating. If desired, an electroplating conductor layer (not shown) may be formed on the electroless deposition conductor layer 11.

Figure 1C:
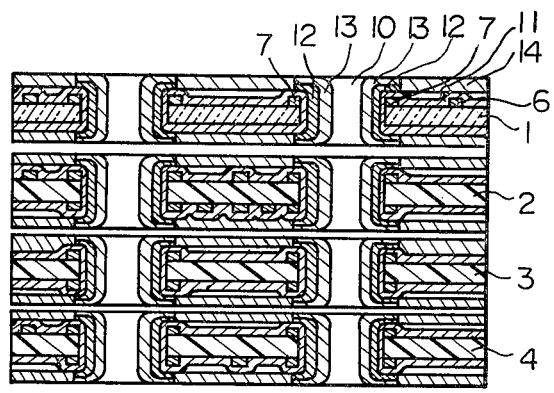

Referring to FIG. 1C, a plated resist 14 is formed by conventional means on the portions, on which no ground conductor pattern has been formed, to a thickness greater that that of electroplating conductor layers to be later formed thereon. Then, a first through hole conductor plating layer 12 is formed on the inner walls of the through holes 10 and on at least part of the land conductor pattern 7. The first through hole conductor plating layer 12 serves as a through connection between signal conductor patterns and a support for the superposed substrates and spacer, when the substrates and spacer are superposed to construct the hollow multilayer printed wiring board. Thereafter, a second through hole plating layer 13 of a low melting point metal is formed on the first through hole conductor plating layer 12 while the plated resist 14 still remains. The second through hole plating layer 13 serves as a through connection between signal conductor patterns, a support for the superposed substrate and spacer, and an interlayer adhesion, when the substrates and spacer are superposed upon another. It also serves as a resist when each substrate or spacer is etched after the resist 14 is removed therefrom. It is preferable that the second through hole plating layer 13 have a thickness such that the second through hole plating layer 13 does not flow out when heat and pressure are applied thereto in the subsequent step of lamination. Usually, the thickness of the second plating layer 13 may be approximately 5 to 10 microns.

Figure 1D:
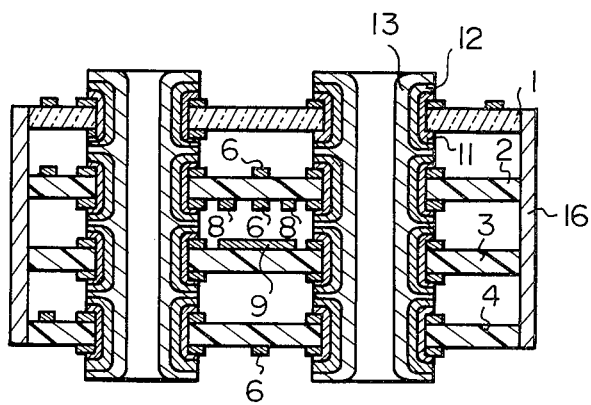

Referring to FIG. 1D, the plated resist 14 (shown in FIG. 1C) is removed and, then, portions of the electroless deposition layer 11 (shown in FIG. 1C), which portions are not covered by the first and second through hole plating layers 12 and 13, are removed by means of flash etching. The substrates 1, 2 and 4 and the spacer 3 are correctly brought into superposed position by utilizing reference registering holes (not shown), which are previously formed in each of the substrates and spacer, and then, adhered together under the application of heat and pressure. Here, the heat applied should be of a quantity sufficient to melt the second through hole plating layer 13.

If desired, a side wall or walls 16 made of an organic synthetic resin or a metal are formed on the side periphery of the superposed substrates and spacer, thereby to seal the spaces between the superposed substrates and spacer. Each sealed space may be filled with an insulative liquid or gas, which serves as a cooling medium, in order to enhance the cooling performance of the hollow multilayer printed wiring board. If the dielectric constant of the liquid filled in the sealed spaces is suitably selected, it is possible to freely set not only the cooling performance but also the dielectric constant of the whole multilayer printed wiring board.

Figure 2A:
FIGS. 2A through 2G schematically represent, in cross-section, the sequential steps of manufacturing a hollow multilayer printed wiring board according to another preferred embodiment of the process of the present invention.

Referring to FIGS. 2A through 2G, illustrating the sequential steps of manufacturing the hollow multilayer printed wiring board from insulation-treated metal sheets, first, through holes 18 are bored in a metal sheet 17 by means of, for example, drilling, laser or chemical etching (FIG. 2A). The sheet 17 is made of a metal which is capable of being readily anodically oxidized, such as aluminum, magnesium, titanium or thallium.

Figure 2B:
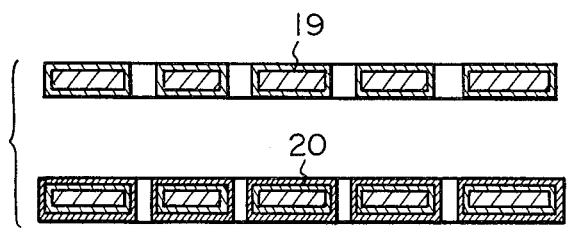

Secondly, the entire surface of the bored metal sheet 17 including the inner walls of the through holes 18 is anodically oxidized to form an insulation film layer 19 serving a substrate for supporting a conductor pattern thereon (FIG. 2B, the upper figure). Alternatively, the insulation film layer 19 may be formed by depositing an insulation material onto the metal sheet, for example, by coating the metal sheet with an organic synthetic resin or an inorganic insulation material, or by sputtering the metal sheet. An optimum insulation-treated metal sheet is prepared by first anodically oxidizing the metal sheet to form the anodically oxidized insulation film layer 19 and, then, depositing an insulation material 20 thereon (FIG. 2B, the lower figure).

Figure 2C:
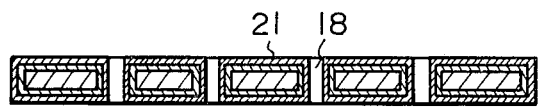

Thirdly, a conductor layer 21 is formed on the entire surface of the insulation-treated metal sheet including the inner walls of the through holes 18 (FIG. 2C in which layer 20 is shown as combined with layer 19). The formation of the conductor layer 21 may be effected by conventional procedures, such as electroless deposition, printing, ion plating and vapor deposition. These procedures may be employed alone or in combination. If desired, the sheet having the conductor layer 21 formed thereon may be electroplated to increase the thickness of the conductor layer 21.

Figure 2D:
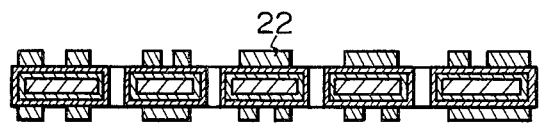

Fourthly, the sheet is laminated with a photosensitive plastic resin or inorganic material layer, followed by pattern exposure and development, thereby to form a resist pattern 22 covering the portions other than those on which the intended conductor pattern is to be formed (FIG. 2D).

Figure 2E:
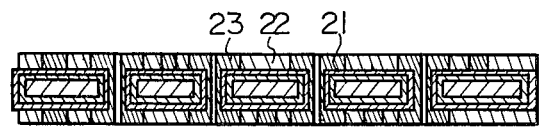

Fifthly, a conductor layer 23 is formed on the region where resist does not exist, including the inner walls of the through holes by electroplating or printing (FIG. 2E). If desired, both surfaces of the conductor-formed sheet are subjected to a smoothing treatment. Then, a low melting point metal (not shown) is deposited onto the conductor layer 23 by electroplating, printing or vapor deposition.

Figure 2F:
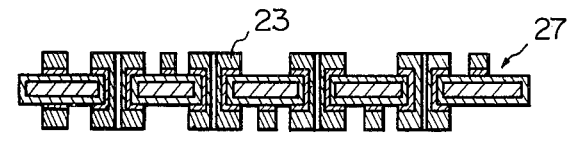
Figure 2G:
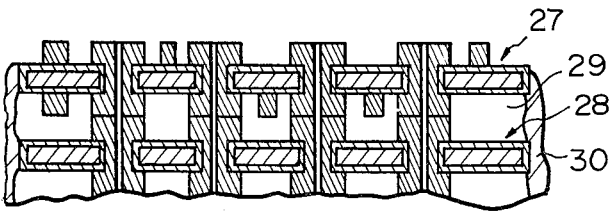

Sixthly, the resist 22 (shown in FIG. 2E) is removed and, then, the exposed portions of the conductor layer 21 (shown in FIG. 2E) are removed by means of flash etching to obtain a printed substrate 27 (FIG. 2F). When the conductor layer 23 is formed by printing a conductor paste in the preceding fifth step, the printed conductor paste is dried, and then, the resist 22 and the portions of the conductor layer 21 are removed as mentioned above, and finally, the dried printed conductor paste is heated at a sintering temperature to form a metallized conductor layer 23.

Finally, a plurality of the printed substrates 27 and one or more spacers 28 are superposed in a manner such that a spacer 28 is interposed between every two printed substrates 27. The superposed substrates and spacer or spacers are adhered together by applying either heat and pressure or laser, thereby melting the low melting point metal layer to obtain a hollow multilayer printed wiring board. The spacer 28 may be prepared in a manner similar to that mentioned above with reference to the preparation of the substrate 27. If desired, the spaces present between the superposed substrates may be sealed by forming a side wall or walls 30 on the side periphery of the hollow multilayer printed wiring board. Furthermore, the side wall or walls 30 may be bored in order to fill the sealed spaces with a suitable insulative gas or liquid.

Figure 3A:
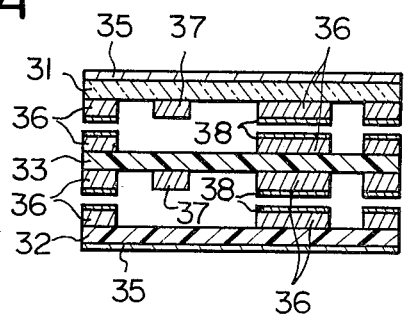
FIGS. 3A through 3C schematically represent, in cross-section, the sequential steps of manufacturing a hollow multilayer printed wiring board according to still another preferred embodiment of the process of the present invention.
Figure 3B:
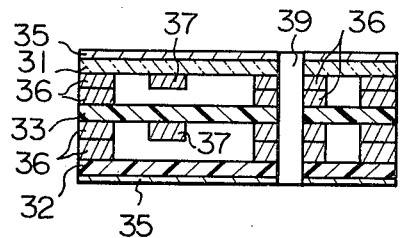
Figure 3C:
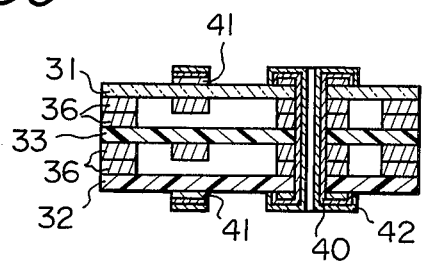

FIGS. 3A through 3B exemplify the hereinbefore mentioned second process wherein printed substrates having no plated through holes are superposed upon each other and, then plated through holes are bored in the superposed substrates. Referring to FIGS. 3A through 3B, three substrates 31, 32 and 33 are used which are prepared from substrates each having conductor foils formed on both surfaces thereof. Each of the three substrates has a conductor pattern or patterns on at least one surface thereof. Namely, as illustrated in FIG. 3A, each of the two surface substrates 31 and 32 has a conductor foil 35 remaining on one surface thereof and a ground conductor pattern 36 and a signal conductor pattern 37 on the other surface thereof. The intermediate substrate 33 has ground conductor patterns 36 and signal conductor patterns 37 on both surfaces thereof. A plated layer 38 comprised of an alloy having a relatively high melting point is formed on all of the ground conductor patterns 36. The three substrates 31, 32 and 33 are superposed upon one another as shown in FIG. 3A, and then, adhered together by applying heat and pressure sufficient to melt the plated alloy layer 38. Thereafter, through holes 39 are bored in the superposed ground conductor pattern portions 36 (FIG. 3B). Then, the adhered substrates are subjected to panel plating to deposit a conductor 40 on the inner walls of the through hole 39, and thereafter, the adhered substrates are subjected to plating with an alloy having a melting point lower than that of the plated alloy layer 38. Then, the conductor foils 35 on the surfaces of the substrates 31 and 32 are etched to form surface signal conductor patterns 41. Whereby, a hollow multilayer printed wiring board of a closed type is obtained (FIG. 3C).

Figure 4A:
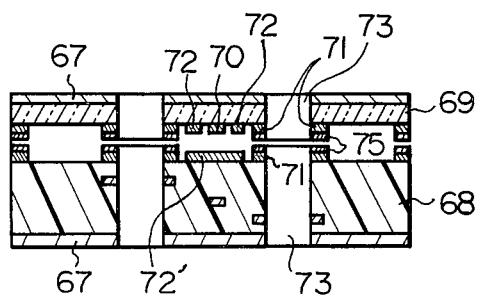
FIGS. 4A through 4C schematically represent, in cross-section, the sequential steps of manufacturing a modified hollow multilayer printed wiring board having a non-hollow multilayer printed wiring board substrate.

In view of the thermal resistance of the hollow multilayer printed wiring board of the invention, it is preferable that at least one of the substrates located on the surfaces of the multilayer printed wiring board be made of an inorganic thermally resistant material, such as a ceramic or an insulation-treated metal, as illustrated in FIGS. 1A, 3A and 4A (mentioned below). This is advantageous particularly where parts are directly bonded to the multilayer printed wiring board upon packaging.

Furthermore, at least one of the substrates of the multilayer printed wiring board of the invention may be a non-hollow multilayer printed wiring board. One example of the multilayer printed wiring board having as one substrate a non-hollow multilayer printed wiring board is illustrated in FIG. 4C. Referring to FIG. 4C, the hollow multilayer printed wiring board has a substrate of a non-hollow multilayer printed wiring board 35 68 of a thermally resistant organic resin material and a surface substrate 69 of ceramic material. The two substrates are superposed upon each other with a predetermined space therebetween and bonded by low melting point metal layers 75 and through hole plating layers 76 formed on the inner walls of the through holes.

Figure 4B:
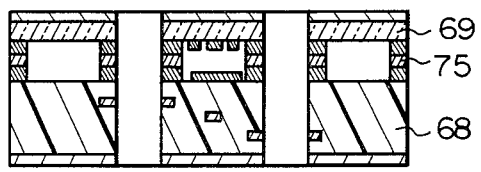
Figure 4C:
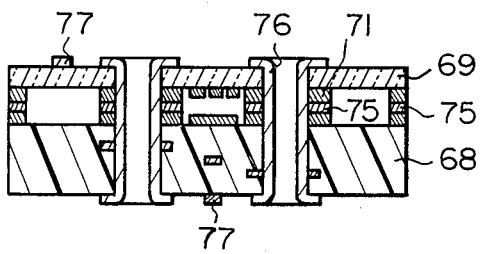

The hollow multilayer printed wiring board of FIG. 4C is manufactured by the sequential steps illustrated in FIGS. 4A through 4C. Namely, a ceramic substrate having a conductor foil 67 formed on its upper surface and a ground conductor pattern 71, a signal conductor pattern 70 and a second ground conductor pattern 72 formed on the lower surface is prepared (FIG. 4A). A non-hollow multilayer printed wiring board 68 having a ground conductor pattern 71 and a second ground conductor pattern 72' formed on its upper surface and a conductor foil 67 formed on the lower surface is prepared (FIG. 4A). Both the ceramic substrate 69 and the multilayer printed wiring board 68 have through holes 73 bored in the ground conductor patterns 71. The signal conductor pattern 70 formed on the lower surface of the substrate 69 is sandwiched between conductors of the first ground conductor pattern 72 electrically isolated from the signal conductor pattern 70 and formed on the same surface, and furthermore, the second ground conductor pattern 72' is formed on the upper surface of the multilayer printed wiring board 68 so that the ground conductor pattern 72' covers the signal conductor pattern 70.

Referring to FIG. 4B, the confronting surfaces of the ceramic substrate 69 and the multilayer printed wiring board 68 are plated with a low melting point metal 75 on the ground conductor patterns 71 and on the peripheral edge portions thereof, and then, the ceramic substrate 69 and the non-hollow multilayer printed wiring board 68 are adhered to each other by applying pressure and heat thereto.

Referring to FIG. 4C, the superposed ceramic substrate 69 and non-hollow multilayer printed wiring board 68 are plated with a conductor on the inner walls and upper and lower end portions of the through holes 73 to form through hole plating conductor layers 76. Simultaneously therewith, surface signal conductor patterns 77 are formed on the upper surface of the ceramic substrate 69 and on the lower surface of the non-hollow multilayer printed wiring board 68. The low melting point metal layer 75 forming the side peripheral wall of the superposed substrates serves as a barrier for preventing both an electrolyte used in the step of forming the through hole plating layers 76 and an etchant used in the step of forming the surface signal conductor patterns 77 from penetrating into the space between the two substrates.

In order to minimize the occurrence of a crosstalk phenomenon, reduce the apparent dielectric constant of the hollow multilayer printed wiring board and enhance the impedance thereof, the hollow multilayer printed wiring board of the invention may be of one of the following two structures.

The first structure is such that, as hereinbefore described with reference to FIGS. 1A and 4A, the signal conductor pattern formed on the surface of each substrate is sandwiched between conductors of a first ground conductor pattern electrically isolated from the signal conductor pattern and formed on the same surface of the substrate as that on which the signal conductor pattern is formed. The signal conductor pattern is covered with a second ground conductor pattern electrically isolated from the signal conductor pattern and formed on the confronting surface of the substrate or spacer adjacent to the substrate having the signal conductor pattern; the second ground conductor pattern having an area sufficient for covering the signal conductor pattern and the conductors of the first ground conductor pattern. Referring to FIGS. 1A through 1D, although the above-mentioned first structure is formed with respect to a portion of the signal conductor pattern 6 formed on the lower surface of the substrate 2, similar structures may be formed with respect to other portions of the signal conductor pattern formed on the same surface of the substrate 2 or the signal conductor patterns formed on the other substrates.

Figure 11A:
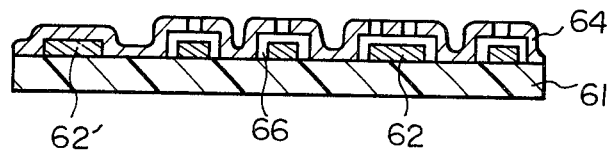
FIG. 11A schematically represents, in cross-section, one example of the printed substrates used in the present invention.

The second structure is such that the signal conductor pattern formed on at least one surface of each substrate is covered with a ground conductor pattern electrically isolated from the signal conductor pattern and formed on the same surface of the substrate as that on which the signal conductor pattern is formed. One example of the second structure is illustrated in FIG. 11A. In FIG. 11A, a signal conductor pattern 62 formed on a substrate 61 is covered with a ground conductor pattern 64 formed on the same substrate 61. The signal conductor pattern 62 is electrically isolated from the ground conductor pattern 64, i.e., there is an air space 66 between the signal conductor pattern 62 and the ground conductor pattern 64.

Figure 11B:
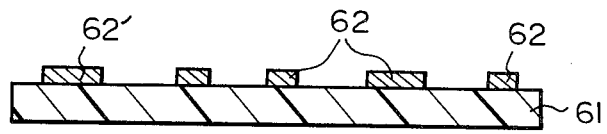
Figure 11C:
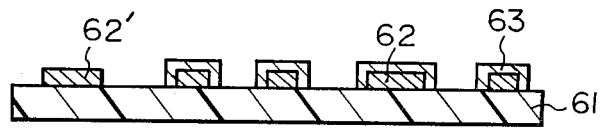

The structure illustrated in FIG. 11A is manufactured by the sequential steps illustrated in FIGS. 11B through 11E. The substrate 61 having the signal conductor pattern 62 and a ground conductor pattern 62' formed on one surface thereof is prepared by a conventional patterning procedure (FIG. 11B). A resist 63 is formed on the signal conductor pattern 62 by screen printing or another conventional coating or laminating procedure, which resist is soluble in a suitable solvent (FIG. 11C). The ground conductor pattern 62' is not coated with the resist 63. Then, the ground conductor pattern 64 is formed on the entire surface of the substrate 61 including the region coated with the resist 63 (FIG. 11D). The formation of the ground conductor pattern 64 may be effected by a conventional plating procedure. Thereafter, the ground conductor pattern 64 is etched by photo-etching to form holes 65 for removing the resist 63 therethrough (FIG. 11E). Then, the resist 63 is dissolved in a solvent and removed through the holes 65, thereby to obtain a substrate of the structure illustrated in FIG. 11A. This substrate may be used as it is. Alternatively, the space 66 (shown in FIG. 11A) between the ground conductor pattern 64 and the signal conductor pattern 62 may be filled with an insulating oil, which has a suitable dielectric constant and other electrical properties, and is chemically stable for impedance matching.

The printed substrate used for manufacturing the hollow multilayer printed wiring board of the invention by the hereinbefore-mentioned second process, i.e., the substrates each having a signal conductor pattern on at least one surface thereof and a ground conductor pattern on at least one surface thereof, and further having a layer of a low melting point metal formed on the conductor pattern, but having no plated through holes, as illustrated in FIG. 3A, can be prepared by one of the following four processes.

A first process comprises the steps of:
(i) laminating or coating with a resist a substrate having conductor foils formed on both surfaces thereof, followed by patterning the resist to form a resist pattern;
(ii) plating the resist-formed substrate with a low melting point metal to form low melting point metal plated layers on the regions on which the signal conductor pattern and the land conductor pattern are to be formed;
(iii) removing the resist from the substrate; and
(iv) etching the substrate to remove the exposed portions of the conductor foils.

A second process is similar to the above-mentioned first process except that the resist-formed substrate obtained by the step (i) is, prior to the step (ii), plated with a conductor to form plated conductor layers on the regions on which the signal conductor pattern and the ground conductor pattern are to be formed.

A third process comprises the steps of:
(i) laminating or coating with a resist a substrate having conductor foils formed on both surfaces thereof, followed by patterning the resist to form a resist pattern;
(ii) etching the resist-formed substrate to remove the exposed portions of the conductor foils;
(iii) removing the resist from the substrate; and
(iv) forming layers of a low melting point metal on at least the so formed ground conductor pattern.

A fourth process comprises the steps of:
(i) laminating or coating with a resist a substrate having conductor foils formed on both surfaces thereof, followed by patterning the resist to form a resist pattern;
(ii) electroplating the resist-formed substrate to form electroplated conductor layers on the regions on which the signal conductor pattern and the ground conductor pattern are to be formed;
(iii) removing the resist from the substrate;
(iv) etching the substrate to remove the conductor foils; and
(v) forming layers of a low melting point metal on at least the so formed ground conductor pattern.

The printed substrates used for manufacturing the hollow multilayer printed board of the invention by the hereinbefore mentioned first process, i.e., the substrates having a signal conductor pattern formed on at least one surface thereof and a ground conductor pattern on at least one surface thereof and further having plated through holes in the ground conductor pattern, layers of a low melting point metal being formed at least on the upper and lower end surfaces of each of the plating layers defining the plated through holes, can be prepared by one of the following processes.

A first process comprises the steps of:
(i) preparing a substrate having through holes therein;
(ii) subjecting the substrate to electroless plating to form an electroless plated conductor layer on the entire surface of the substrate including the inner walls of the through holes;
(iii) laminating the electroless-plated substrate with a resist followed by patterning the resist to form a resist pattern;
(iv) electroplating the resist-formed substrate to form electroplated conductor layers on the regions on which a signal conductor pattern and a ground conductor pattern are to be formed and on the inner wall of each through hole;
(v) plating the electroplated conductor layer-formed substrate with a low melting point metal to form layers of the low melting point metal on at least the electroplated conductor layers formed on the upper and lower ground portions of each through hole;
(vi) removing the resist from the substrate; and
(vii) etching the substrate to remove the exposed portions of the electroless plated conductor layer.

One example of the above-mentioned first process is hereinbefore described with reference to FIGS. 2A through 2F. The steps (i) through (vii) in the above-mentioned first process correspond to FIGS. 2A through 2F as follows.
Step (i): FIGS. 2A and 2B,
Step (ii): FIG. 2C,
Step (iii): FIG. 2D,
Steps (iv) and (v): FIG. 2E, and
Steps (vi) and (vii): FIG. 2F.

A second process is similar to the above-mentioned first process except that the step (v) of forming low melting point metal layers is carried out after the final etching step (vii). That is, the second process comprises the steps of:
(i) preparing a substrate having through holes therein;
(ii) subjecting the substrate to electroless plating to form an electroless plated conductor layer on the entire surface of the substrate including the inner walls of the through holes;
(iii) laminating the electroless plated substrate with a resist followed by patterning the resist to form a resist pattern;
(iv) electroplating the resist-formed substrate to form electroplated conductor layers on the regions on which a signal conductor pattern and a ground conductor pattern are to be formed and on the inner wall of each through hole;
(v) removing the resist from the electroplated substrate;

(vi) etching the substrate to remove the exposed portions of the electroless plated conductor layer; and (vii) forming layers of a low melting point metal on at least the upper and lower ground portions of each through hole.

A third process comprises the steps of:

(i) boring through holes in a ground conductor pattern of a substrate having a signal conductor pattern on at least one surface thereof and the ground conductor pattern on at least one surface thereof;

(ii) subjecting the substrate to electroless plating to form an electroless plated conductor layer on the entire surface of the substrate including the inner walls of the through holes;

(iii) laminating the electroless-plated substrate with a resist followed by patterning the resist to form a resist pattern;

(iv) electroplating the resist-formed substrate to form electroplated conductor layers on the inner wall and upper and lower ground portions of each through hole;

(v) plating the electroplated conductor layer-formed substrate with a low melting point metal to form layers of the low melting point metal on at least the electroplated conductor layers formed on the upper and lower ground portions of each through hole;

(vi) removing the resist from the substrate; and then, (vii) etching the substrate to remove the exposed portions of the electroless conductor layer.

One example of the above-mentioned third process is hereinbefore described with reference to FIGS. 1A through 1C. The steps (i) through (vii) in the above-mentioned third process correspond to FIGS. 1A through 1C as follows.

Steps (i) and (ii): FIGS. 1A and 1B,
Steps (iii), (iv) and (v): FIG. 1C, and
Steps (vi) and (vii): not shown.

A fourth process is similar to the above-mentioned third process except that the step (v) of forming low melting point metal layers is carried out after the final etching step (vii). That is, the fourth process comprises the steps of:

(i) boring through holes in a ground conductor pattern of a substrate having a signal conductor pattern on at least one surface thereof and the ground conductor pattern on at least one surface thereof;

(ii) subjecting the substrate to electroless plating to form an electroless plated conductor layer on the entire surface of the substrate including the inner walls of the through holes;

(iii) laminating the electroless plated substrate with a resist followed by patterning the resist to form a resist pattern;

(iv) electroplating the resist-formed substrate to form electroplated conductor layers on the inner wall and upper and lower ground portions of each through hole;

(v) removing the resist from the electroplated substrate;

(vi) etching the substrate to remove the exposed portions of the electroless plated conductor layer; and then, (vii) forming layers of a low melting point metal on at least the upper and lower ground portions of each through hole.

A fifth process comprises the steps of:

(i) laminating with a resist a substrate having conductor foils formed on both surfaces thereof, followed by patterning the resist to form a resist pattern;

(ii) boring through holes in the resist-formed substrate;

(iii) electroplating the substrate to form electroplated conductor layers on the regions on which a signal conductor pattern and a ground conductor pattern are to be formed and on the inner wall of each through hole;

(iv) plating the electroplated conductor layer-formed substrate with a low melting point metal to form layers of the low melting point metal on at least the electroplated conductor layers formed on the upper and lower ground portions of each through hole;

(v) removing the resist from the substrate; and (vi) etching the substrate to remove the exposed portions of the conductor foils.

Figure 5A:
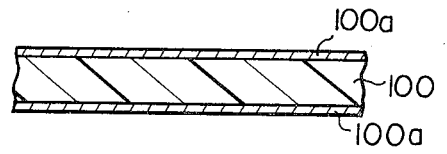
FIGS. 5A through 5F schematically represent, in cross-section, the sequential steps of preparing a printed substrate having through holes.
Figure 5B:
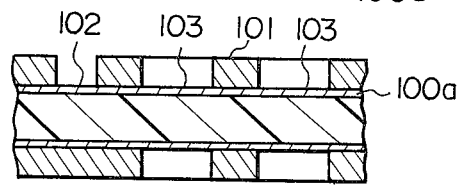
Figure 5C:
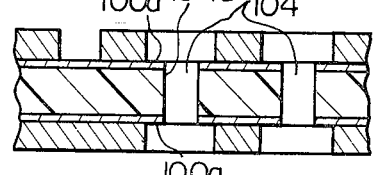
Figure 5D:
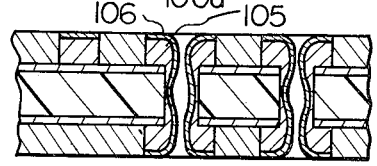
Figure 5E:
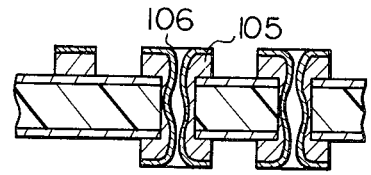
Figure 5F:
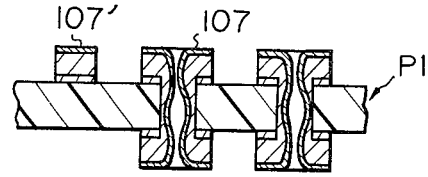

One example of the above-mentioned fifth process is illustrated in FIGS. 5A through 5F. Referring to FIGS. 5A through 5F, a thermally resistant organic synthetic resin substrate 100 having conductor foils 100a on both surfaces thereof is prepared (FIG. 5A). A resist 101 is printed on the substrate 100 to form a resist pattern such that the conductor foils 100a are exposed in the portion 102, on which a signal conductor pattern is to be formed, and in the portions 103, on which ground pattern and through holes are to be formed (FIG. 5B). Through holes 104 are formed (FIG. 5C). The substrate is subjected to electroplating to form conductor layers 105 (FIG. 5D). The electroplated substrate is plated with a low melting point metal to form layers 106 of the low melting point metal on the electroplated conductor layers 105 (FIG. 5D). The resist 101 is removed (FIG. 5E). Then, the substrate is subjected to flash etching to obtain a printed substrate P1 having a signal conductor pattern 107′ and through hole plating layers 107 (FIG. 5F). It is to be noted that, in the electroplating step illustrated in FIG. 5D, the conductor 105 is not directly deposited on the inner walls 104a of the through holes 104, but the conductor 105 once deposited on the portions of the upper and lower conductor foils 100a surrounding the through holes 104 grows and finally covers the entire inner walls 104a as shown in FIG. 5D.

A sixth process is similar to the above-mentioned fifth process except that the step (iv) of forming the low melting point metal layers is carried out after the final etching step (vi). That is, the sixth process comprises the steps of:

(i) laminating with a resist a substrate having conductor foils formed on both surfaces thereof, followed by patterning the resist to form a resist pattern;

(ii) boring through holes in the resist-formed substrate;

(iii) electroplating the substrate to form electroplated conductor layers on the regions on which a signal conductor pattern and a ground conductor pattern are to be formed and on the inner wall of each through hole;

(iv) removing the resist from the electroplated substrate;

(v) etching the substrate to remove the exposed portions of the conductor foils; and (vi) forming layers of a low melting point metal on at least the upper and lower ground portions of each through hole.

A seventh process comprises the steps of:

(i) laminating with a resist a substrate having conductor foils formed on both surfaces thereof, followed by patterning the resist to form a resist pattern;

(ii) boring through holes in the resist-formed substrate;

(iii) electroplated the substrate to form electroplating conductor layers on the region on which a signal conductor pattern is to be formed and on the inner wall of each through hole;

(vi) plating the electroplated conductor layer-formed substrate with a low melting point metal to form layers of the low melting point metal on at least the electroplated conductor layers formed on the upper and lower end portions of each through hole;

(v) removing the resist from the substrate; and then, (vi) etching the substrate to remove the exposed portions of the conductor foils.

Figure 6A:
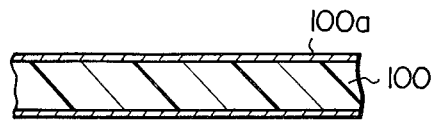
FIGS. 6A through 6F schematically represent, in cross-section, the sequential steps of preparing another printed substrate having through holes.
Figure 6B:
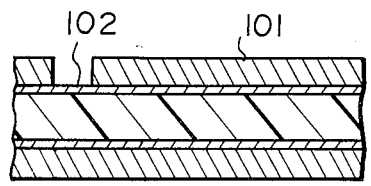
Figure 6C:
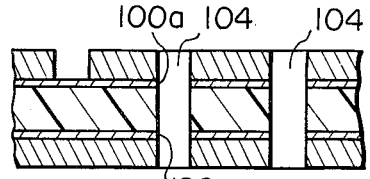
Figure 6D:
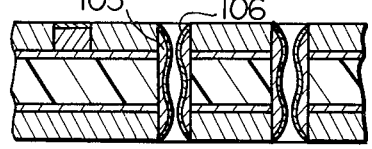
Figure 6E:
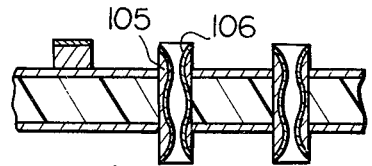
Figure 6F:
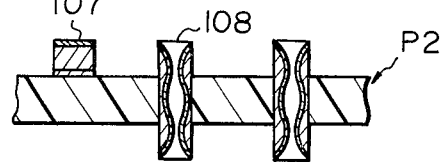

One example of the above-mentioned seventh process is illustrated in FIGS. 6A through 6F. Referring to FIGS. 6A through 6F, a substrate 100 having conductor foils 100a on both surfaces thereof is prepared (FIG. 6A). A resist 101 is printed on the substrate 100 to form a resist pattern such that the conductor foils 100a are exposed only in the portion 102 on which a signal conductor pattern is to be formed (FIG. 6B). Through holes 104 are formed (FIG. 6C). The substrate is subjected to electroplating to form electroplated conductor layers 105 (FIG. 6D). The electroplated substrate is plated with a low melting point metal to form layers 106 of the low melting point metal on the electroplated conductor layers 105 (FIG. 6D). The resist 101 is removed (FIG. 6E). Finally, the substrate is subjected to etching to obtain a printed substrate P2 having a signal conductor pattern 107' and through hole plating layers 108 without ground conductors (FIG. 6F). The printed substrate P2 has no ground conductor around each through hole plating layer. In the above-mentioned electroplating step, the conductor 105 deposited on the portions of the conductor foils 100a exposed to the through holes grows and finally covers the entirety of the inner walls of the through holes (FIG. 6D).

An eighth process is similar to the above-mentioned seventh process except that the step (iv) of forming the low melting point metal layers is carried out after the final etching step (vi). That is, the eighth process comprises the steps of:

(i) laminating with a resist substrate having conductor foils formed on both surfaces thereof, followed by patterning the resist to form a resist pattern;

(ii) boring through holes in the resist-formed substrate;

(iii) electroplated the substrate to form electroplating conductor layers on the region on which a signal conductor pattern is to be formed and on the inner wall of each through hole;

(iv) removing the resist from the electroplated substrate;

(v) etching the substrate to remove the exposed portions of the conductor foils; and (vi) forming layers of a low melting point metal on at least the upper and lower end portions of each through hole.

A ninth process comprises the steps of:

(i) laminating a substrate having conductor foils formed on both surfaces thereof, with a first resist, onto which a conductor is capable of being deposited by electroless plating and then, with a second resist, onto which a conductor is incapable of being deposited by electroless plating, to form a resist pattern;

(ii) boring through holes in the resist-formed substrate;

(iii) subjecting the substrate to electroless plating to form electroless plated conductor layers on the region on which a signal conductor pattern is to be formed and on the inner wall of each through hole;

(iv) electroplating the substrate to form electroplated conductor layers on the electroless plated conductor layers;

(v) plating the electroplated conductor layer-formed substrate with a low melting point metal to form layers of the low melting point metal on at least the electroplated conductor layers formed on the upper and lower end portions of each through hole;

(vi) removing the resist from the substrate; and (vii) etching the substrate to remove the exposed portions of the conductor foils.

Figure 7A:
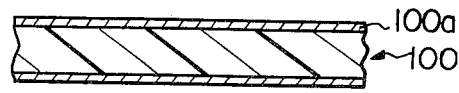
FIGS. 7A through 7G schematically represent, in cross-section, the sequential steps of preparing still another printed substrate having through holes.
Figure 7B:
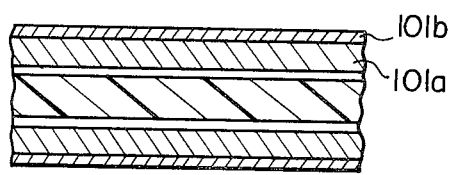
Figure 7C:
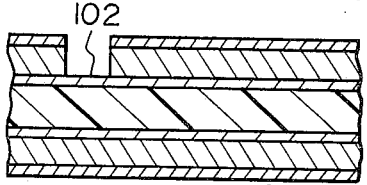
Figure 7D:
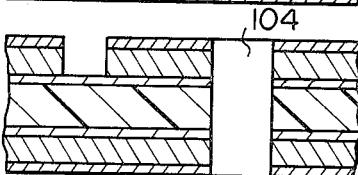
Figure 7E:
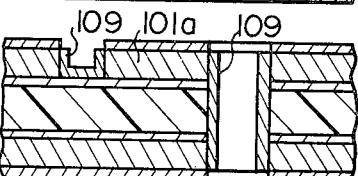
Figure 7F:
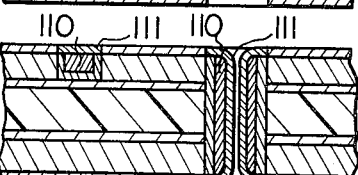
Figure 7G:
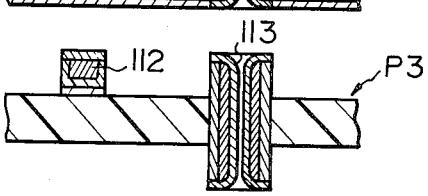

One example of the above-mentioned ninth process is illustrated in FIGS. 7A through 7G. Referring to FIGS. 7A through 7G, a substrate 100 having conductor foils 100a on both surfaces thereof is prepared (FIG. 7A). The substrate 100 is laminated with first photoresists (dry film) 101a and then with second photoresists (dry film) 101b (FIG. 7B). The first photoresists 101a have the property that a conductor is capable of being deposited thereon by electroless deposition, and the second photoresists 101b have the property that a conductor is incapable of being deposited thereon by electroless deposition. The photoresist-laminated substrate is light-exposed and then developed to form a resist pattern such that the conductor foils 100a are exposed in the portion 102 of the conductor foils on which a signal conductor pattern is to be formed (FIG. 7C). Through holes 104 are formed (FIG. 7D). The substrate is subjected to electroless plating to form conductor layers 109 on the exposed portions of the first photoresists 101a (FIG. 7E). The substrate is subjected to electroplating twice to form first conductor plating layers 110 and low melting point metal plating layers 111 (FIG. 7F). The second resists 101b and the first resists 101a are removed, followed by flash etching, thereby to obtain a printed substrate P3 having a signal conductor pattern 112 and groundless through hole plating layers 113 (FIG. 7G).

As a modification of the above-mentioned ninth process explained with reference to FIGS. 7A through 7G, the lamination of the first photoresists 101a may be omitted when the signal conductor pattern 112 and the through hole plating layers 113 (having on ground conductors) are thin. In this modification, a longer time is necessary for the formation of the electroless plating layers 109 as compared with the above-exemplified ninth process.

A tenth process is also a modification of the above-mentioned ninth process. The tenth process is similar to the ninth process except that the step (v) of forming low melting point metal layers is carried out after the final etching step (vii). Thus, the tenth process comprises the steps of:

(i) laminating a substrate having conductor foils formed on both surfaces thereof, with a first resist, onto which a conductor is capable of being deposited by electroless plating and then, with a second resist, onto which a conductor is incapable of being deposited by electroless plating, to form a resist pattern;

(ii) boring through holes in the resist-formed substrate;

(iii) subjecting the substrate to electroless plating to form electroless plated conductor layers on the region on which a signal conductor pattern is to be formed and on the inner wall of each through hole;

(iv) electroplating the substrate to form electroplated conductor layers on the electroless plated conductor layers;

(v) removing the resist from the substrate;

(vi) etching the substrate to remove the exposed portions of the conductor foils; and (vii) forming layers of a low melting point metal on at least the upper and lower end portions of each through hole.

An eleventh process is another modification of the above-mentioned ninth process explained with reference to FIGS. 7A through 7G. The eleventh process comprises the steps of:

(i) laminating with a resist a substrate having conductor foils formed on both surfaces thereof, followed by patterning the resist to form a resist pattern;

(ii) boring through holes in the resist-formed substrate;

(iii) subjecting the substrate to electroless plating to form an electroless plated conductor layer on the entire surface of the substrate including the inner walls of the through holes;

(iv) removing the uppermost and lowermost portions of the electroless plated conductor layer to expose the uppermost and lowermost portions of the resist;

(v) electroplating the resist-exposed substrate to form electroplated conductor layers on the region on which a signal conductor pattern is to be formed and on the inner wall of each through hole;

(vi) plating the electroplated layer-formed substrate with a low melting point metal to form layers of the low melting point metal on at least the electroplated conductor layers formed on the upper and lower end portions of each through hole;

(vii) removing the resist from the substrate; and (viii) etching the substrate to remove the exposed portions of the electroless plated conductor layer.

Figure 8A:
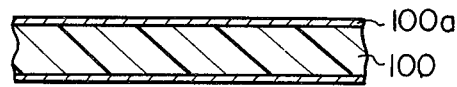
FIGS. 8A through 8H schematically represent, in cross-section, the sequential steps of preparing still another printed substrate having through holes.
Figure 8B:
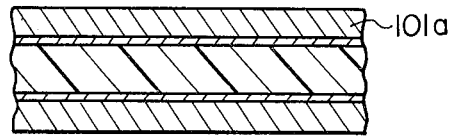
Figure 8C:
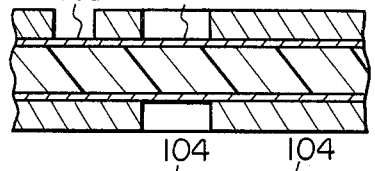
Figure 8D:
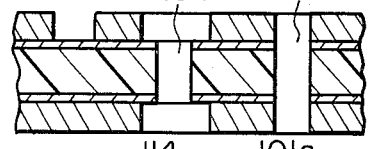
Figure 8E:
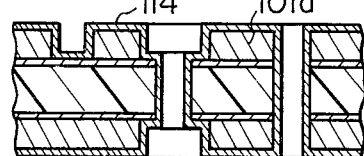
Figure 8F:
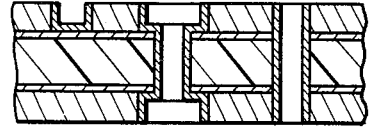
Figure 8G:
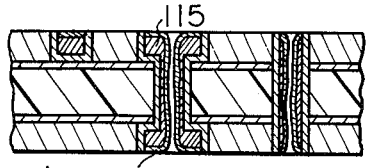
Figure 8H:
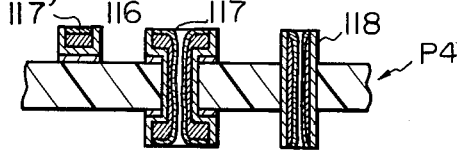

The above-mentioned eleventh process is illustrated in FIGS. 8A through 8G. A substrate 100 having conductor foils 100a on both surfaces thereof (FIG. 8A) is laminated with photoresists 101a having a property such that a conductor is capable of being deposited thereon by electroless plating (FIG. 8B). The photoresists 101a are light-exposed and developed to form a resist pattern such that the conductor foils 100a are exposed in the portion on which a signal conductor pattern is to be formed and in the portions 103 on which ground conductors and through holes are to be formed (FIG. 8C). Through holes 104 are formed (FIG. 8D). The substrate is subjected to electroless plating to form a conductor plated layer 114 (FIG. 8E). The conductor plated layer 114 extends over the entire surface of the surface, and therefore, the portions of the conductor layer 114, which are formed on the uppermost and lowermost surfaces of the resists 101a, are removed, for example, by polishing or using an adhesive tape (FIG. 8F). Instead of removing the portions of the conductor plated layer 114, an insulation material such as a resin may be coated on the uppermost and lowermost surfaces of the conductor plated layer 114. The substrate is then subjected to electroplating to form conductor plated layers 115 (FIG. 8G). The electroplated substrate is plated with a low melting point metal to form layers 116 of the low melting point metal on the conductor plated layers 115 (FIG. 8G). The resists 101a are removed, followed by flash etching, thereby to obtain a printed substrate P4 having a signal conductor pattern 117', through hole plated layers 117 with ground conductors and through hole plated layers 118 without ground conductors (FIG. 8H).

A twelfth process is similar to the above-mentioned eleventh process except that the step (vi) of forming the low melting point metal layers is carried out after the final etching step (viii). Thus, the twelfth process comprises the steps of:

(i) laminating with a resist a substrate having conductor foils formed on both surfaces thereof, followed by patterning the resist to form a resist pattern;

(ii) boring through holes in the resist-formed substrate;

(iii) subjecting the substrate to electroless plating to form an electroless plated conductor layer on the entire surface of the substrate including the inner walls of the through holes;

(iv) removing the uppermost and lowermost portions of the electroless plated conductor layer to expose the uppermost and lowermost portions of the resist;

(v) electroplating the resist-exposed substrate to form electroplated conductor layers on the region on which a signal conductor pattern is to be formed and on the inner wall of each through hole;

(vi) removing the resist from the electroplated substrate;

(vii) etching the substrate to remove the exposed portions of the electroless plated conductor layer; and (viii) forming layers of a low melting point metal on at least the upper and lower end portions of each through hole.

The above-mentioned fifth through twelfth processes are advantageous over the above-mentioned first through fourth processes in the following point. The first through fourth processes involve the electroplating step between the through holes-forming step and the resist pattern-forming step. In these processes, the substrate is subject to dimensional change in the electroplating step due to moisture absorption and temperature change, and therefore, the resist pattern formed loses correct alignment with the through holes. For this reason, it is difficult to minimize or omit the ground conductor portions in the substrate in order to produce a multilayer printed wiring board having a high density. In contrast to the first through fourth processes, in the above-mentioned fifth through twelfth processes, no dimensional change of the substrate occurs between the resist pattern-forming step and the through hole-forming step, and thus, the resulting substrate can be advantageously used for the manufacture of a multilayer printed wiring board of a particularly high density. In the above-mentioned ninth and tenth processes, the light-exposed photoresists are developed (FIG. 7C). However, this development is carried out prior to the formation of the through holes 104. Therefore, the moisture absorption of the substrate occurs only to a negligible extent, and thus, the resist pattern can be in correct alignment with the through holes.

In the process of manufacturing the multilayer printed wiring board of the invention, it is desired or required to enlarge the thickness of portions of the ground conductor pattern surrounding the through holes bored in each substrate as compared with the thickness of the other portions of the land conductor pattern, in order to obtain the desired interlayer distance between the respective substrates. This is advantageously achieved by a process which comprises the steps of:

(i) forming a first conductor pattern on a substrate, and (ii) a resist is formed on portions of the first conductor pattern, followed by forming a second conductor pattern on the other portions of the first conductor pattern on which the resist has not been formed. This process will be described in the following with reference to FIGS. 9A through 9D.

Figure 9A:
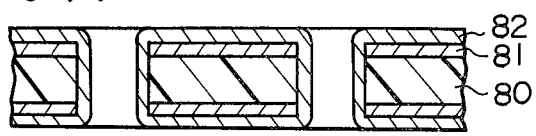
FIGS. 9A through 9D schematically represent, in cross-section, the sequential steps of preparing another printed substrate used in the present invention.
Figure 9B:
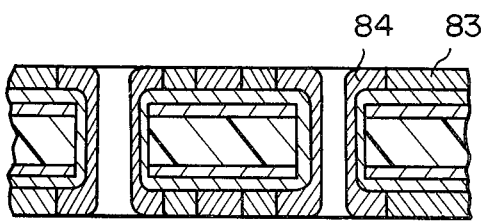
Figure 9C:
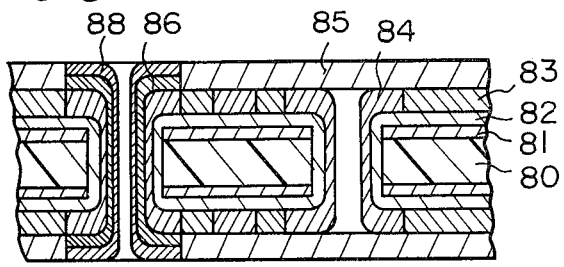
Figure 9D:
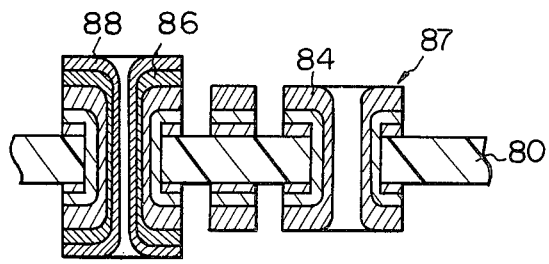

Referring to FIGS. 9A through 9D, a substrate 80 having conductor foils 81 formed on both surfaces thereof is bored to form through holes, and then, the entire surface of the substrate including the inner walls of the through holes is electroplated to form a conductor layer 82 (FIG. 9A). A first resist 83 is formed on the conductor-plated substrate 81 by a procedure wherein a photoresist is laminated thereon followed by light exposure and development or a screen printing procedure, and then, the substrate is electroplated to form a first conductor pattern 84 (FIG. 9B). Thereafter, a second resist 85 is formed on the first resist 83 and on portions of the first conductor pattern 84, and then, the substrate is electroplated to form a second conductor pattern 86 on the other portions of the first conductor pattern 84 on which portions the second resist 85 has not been formed (FIG. 9C). Then, the substrate is plated with a low melting point metal to form layers 88 of a low melting point metal on the second conductor pattern 86 (FIG. 9C). Finally, the first resist 83 and the second resist 85 are removed from the substrate, and then, the substrate is subjected to flash etching thereby to obtain a printed substrate shown in FIG. 9D, which has thicker conductor portions than the other conductor portions. In the above-mentioned process, it is preferable that, prior to the formation of the second resist 85, the predominant surfaces of the first resist 83 and the first conductor pattern 84 formed on the substrate are subjected to leveling by polishing the predominant surfaces, for example, by using a sand paper. Such leveling enhances the bond strength of the second resist 85 and the uniformity in thickness of the first conductor pattern 84. The above-mentioned process for preparing a printed substrate having thick conductor portions and thin conductor portions can be applied to any of the hereinbefore-mentioned processes for the preparation of printed substrates.

The formation of a conductor pattern or patterns on the substrate may be effected by an additive process, a substractive process and other conventional processes. However, the semi-additive process, described below, is most preferable in order to obtain a conductor pattern of a high precision. The semi-additive process comprises the following sequential steps (i) through (vii), which are diagrammatically illustrated in FIGS. 10A through 10H.

Figure 10A:
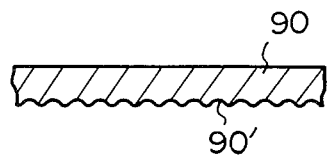
FIGS. 10A through 10H schematically represent, in cross-section, the sequential steps of forming a conductor pattern on a substrate.

(i) A surface of an aluminum foil 90 is roughened by means of, for example, etching or anodic oxidation (FIG. 10A).

Figure 10B:
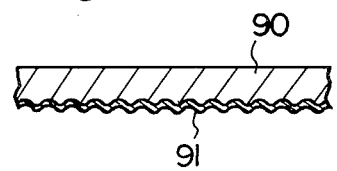

(ii) The roughened surface 90' is plated with a thin conductor layer 91 (FIG. 10B). This plating may be of either dry or wet type. The thickness of the conductor layer 91 is preferably less than 2 microns, more preferably less than 0.5 micron.

(iii) If desired, the exposed surface of the thin conductor layer 91 is chemically treated.

Figure 10C:
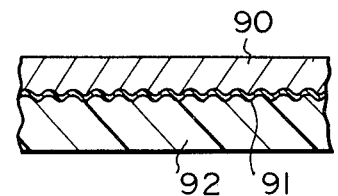

(iv) The conductor-plated aluminum foil is superposed on a substrate 92 so that the conductor layer 91 faces the substrate 92, and then, adhered together by applying heat and pressure (FIG. 10C).

Figure 10D:
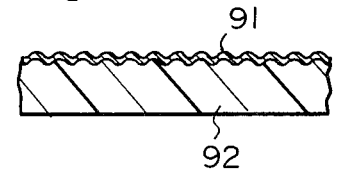
Figure 10E:
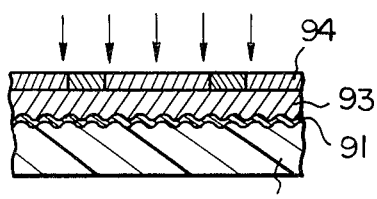

(v) The aluminum foil is removed while the thin conductor layer 91 remains on the substrate 92 (FIG. 10D).

The removal of aluminum is effected by mechanical peeling or chemical etching. The obtained substrate 92 having the thin conductor layer 91 may be treated by a conventional semi-additive process as follows.

Figure 10F:
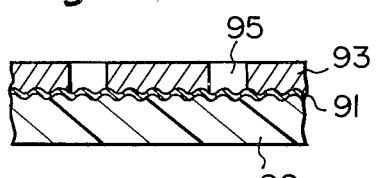
Figure 10G:
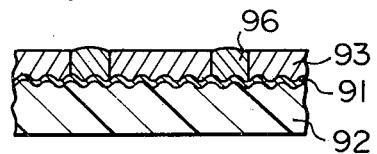

(vi) The substrate 92 having the thin conductor layer 91 is coated or laminated with a photoresist 93, and an artwork film 94 is placed on the photoresist 93, followed by light exposure (FIG. 10E) and development of the photoresist 93 to remove portions of the photoresist 93 in the pattern region 95 (FIG. 10F).

Figure 10H:
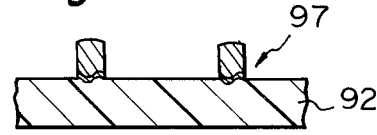

(vii) A plating conductor layer 96 is formed in the pattern region 95 (FIG. 10G), and then, the photresist 93 is removed and finally, portions of the thin conductor layer 91 present in the non-pattern region are removed by etching to obtain the substrate 92 having a conductor pattern 97 (FIG. 10H).

The conductor layer 91 formed on the substrate 92 by the above-mentioned steps (i) through (v) (FIGS. 10A through 10D), is characterized in that it can be far thinner than a conductor layer formed by a conventional procedure. Therefore, the portions of the conductor layer 91 present in the non-patterned region can be removed within a short period of time in the above-mentioned etching step (vii) (FIGS. 10G and 10H), and thus, the conductor 96 does not become thin during the etching step.

The advantages of the hollow multilayer printed wiring board of the present invention are summarized as follows.

(i) The hollow multilayer printed wiring board has through hole conductor plating layers serving as an interlayer adhesion and a through connection between the printed substrates and, hence, exhibits good heat dissipation and enhanced dimensional stability. This is in striking contrast to a conventional non-hollow multilayer printed wiring board having a structure such that the printed substrates are adhered to each other by interposed glass cloths inpregnated with a partially cured synthetic resin. The synthetic resin-impregnated glass cloths exhibit great shrinkage upon curing.

(ii) The hollow multilayer printed wiring board exhibits good thermal resistance. This is particularly true when the surface substrates are made of an inorganic material such as ceramics or an insulation-treated metal and the intermediate substrates are made of an insulation-treated metal. Therefore, parts can be directly bonded to the surface of the hollow multilayer printed wiring board.

(iii) The occurrence of a crosstalk phenomenon can be minimized particularly when the hollow multilayer printed wiring board has a structure such that the signal conductor is covered or surrounded with ground conductors.

We claim:

1. A hollow multilayer printed wiring board comprising a plurality of superposed substrates,
   each said superposed substrate having a signal conductor pattern formed on at least one surface of said superposed substrate and a ground conductor pattern formed on at least one surface of said superposed substrate,
   said superposed substrates being superposed upon each other with a predetermined space therebetween being filled with an insulative gas or liquid,
   each said superposed substrate having plated through holes in the ground conductor pattern, said plated through holes comprising a plating layer having upper and lower end surfaces, each of said plated through holes being in line with at least one other said plated through hole of each of the adjacent superposed substrates to form an interstitial hole, a layer of a low melting point metal being formed at least on the upper and lower end surfaces of the plated layer defining each said plated through hole, said layer of a low melting point metal serving as a through connection between two or more said signal conductor patterns of the superposed substrates and as an interlayer adhesion between the superposed substrates, all but one of the superposed substrates being made of one of a first group of materials consisting of a thermally resistant organic synthetic resin sheet and an insulation-treated metal sheet, said one of said superposed substrates being made of materials from a second group.

2. A hollow multilayer printed wiring board according to claim 1, wherein said hollow multilayer printed wiring board has at least one side wall for sealing the spaces between the superposed substrates.

3. A hollow multilayer printed wiring board according to claim 1 or 2, further comprising a spacer, having ground conductor patterns formed on both sides thereof, interposed between the adjacent superposed substrates so that there are provided predetermined spaces between the spacer and the neighboring superposed substrates, said spacer having plated through holes in the ground conductor patterns, each of said plated through holes being in line with said plated through holes of the adjacent superposed substrates to form the interstitial hole.

4. A hollow multilayer printed wiring board according to claim 1 or 2, wherein said insulation-treated metal sheet is an anodically oxidized metal sheet.

5. A hollow multilayer printed wiring board according to claim 1 or 2, wherein said insulation-treated metal sheet is a metal sheet having an insulation material layer deposited thereon.

6. A hollow multilayer printed wiring board according to claim 1 or 2, wherein said insulation-treated metal sheet is an anodically oxidized metal sheet having an insulation material coated thereon.

7. A hollow multilayer printed wiring board according to claim 1 or 2, wherein said thermally resistant organic synthetic resin sheet is made of a polyimide, an epoxy resin or a triazine resin.

8. A hollow multilayer printed wiring board according to claim 1, or 2 wherein at least one of the surface substrates of said hollow multilayer printed wiring board is made of an inorganic thermally resistant material from said second group.

9. A hollow multilayer printed wiring board according to claim 8, wherein the inorganic thermally resistant material is from a group consisting of ceramic material and insulation-treated metal.

10. A hollow multilayer printed wiring board according to claim 1 or 2, wherein at least one of the superposed substrates is a non-hollow multilayer printed wiring board.

11. A hollow multilayer printed wiring board according to claim 9, wherein a ceramic substrate, having a signal conductor pattern formed on at least one surface thereof and a ground conductor pattern formed on at least one surface thereof, is superposed at a predetermined space on a nonhollow multilayer printed wiring board made of a thermally resistant organic synthetic resin material and having a ground conductor pattern on at least one surface thereof facing the ceramic substrate, said ceramic substrate having plated through holes in the ground conductor pattern, each of said plated through holes being in line with a plated through hole in the ground conductor pattern on the non-hollow multilayer printed wiring board to form the interstitial hole.

12. A hollow multilayer printed wiring board according to claim 1 or 11, wherein said signal conductor pattern is covered with a ground conductor pattern electrically isolated from the signal conductor pattern and formed on the same surface of the superposed substrate as that on which the signal conductor pattern is formed.

13. A hollow multilayer printed wiring board according to claim 1 or 11, wherein said signal conductor pattern is sandwiched between conductors of a first ground conductor pattern electrically isolated from the signal conductor pattern and formed on the same surface of the substrate as that on which said signal conductor pattern is formed, and said signal conductor pattern being covered with a second ground conductor pattern electrically isolated from the signal conductor pattern and formed on the facing surface of the superposed substrate or spacer adjacent to the superposed substrate having the signal conductor pattern, said second ground conductor pattern having an area sufficient for covering the signal conductor pattern and the conductors of the first ground conductor pattern.

14. A hollow multilayer printed of wiring board according to claim 9, further comprising:
a non-hollow multilayer printed wiring board made of a thermally resistant organic synthetic resin material and having a ground conductor pattern on at least one surface thereof; and
a ceramic substrate, having a signal conductor pattern formed on at least one surface thereof and a ground conductor patern formed on at least one surface thereof, superposed at a predetermined space on the non-hollow multilayer printed wiring board, said ceramic substrate and said non-hollow multilayer printed wiring board having through connection pads in the ground conductor patterns, said ceramic substrate facing at least one surface of said non-hollow multilayer wiring board, so that each of said through connection pads of said ceramic substrate is in line with one of the through connection pads on the non-hollow multilayer printed wiring board to allow formation of the interstitial hole.

* * * * *

UNITED STATES PATENT AND TRADEMARK OFFICE
CERTIFICATE OF CORRECTION

PATENT NO. : 4,368,503
DATED : JANUARY 11, 1983
INVENTOR(S) : KEIJI KUROSAWA ET AL.

It is certified that error appears in the above-identified patent and that said Letters Patent is hereby corrected as shown below:

```
Front page, [57] ABSTRACT,
               line 6, each of which substrate" should be
                       --.  Each of the substrates--;
               line 8, "land" should be --ground--;
               line 10, "land" should be --ground--;
               line 12, after "a" insert --continuous--;
               line 13, "via" should be--through--;
               line 15, after "each" insert. --of the--;
                        and "," should be --.--;
               line 16, "which" should be --This--.

Col. 4, line 19, "exempifies" should be --exemplify--.
Col. 5, line 11, "substrate" should be --substrates--.
Col. 11, line 28, after "electroless" insert --plated--.
Col. 13, line 45, "electroplating" should be
                  --electroplated--.
Col. 14, line 43, "on" should be --no--.
Col. 15, line 52, before "layer" insert --plated--.
Col. 18, line 12, "photresist" should be --photoresist--.
Col. 19, line 51, "1, or 2" should be --1 or 2,--.
Col. 20, line 8, "nonhollow" should be --non-hollow--.
```

Signed and Sealed this

First Day of November 1983

[SEAL]

Attest:

GERALD J. MOSSINGHOFF

Attesting Officer

Commissioner of Patents and Trademarks